United States Patent [19]

Frosch et al.

[11] 3,776,633

[45] Dec. 4, 1973

[54] METHOD OF EXPOSURE FOR GHOST LINE SUPPRESSION

[75] Inventors: Albert Frosch; Arno Schmackpfeffer, both of Boeblingen, Germany

[73] Assignee: International Business Machines Corporation, Armonk, N.Y.

[22] Filed: Feb. 10, 1972

[21] Appl. No.: 225,224

[30] Foreign Application Priority Data

Apr. 6, 1971 Germany .................. P 21 16 713.5

[52] U.S. Cl. ...................... 355/132, 355/18, 355/78, 96/36.2

[51] Int. Cl. ............................................ G03c 5/00

[58] Field of Search ................. 96/36.2, 35; 355/78, 355/132, 77, 133, 18; 350/162 R

[56] References Cited

UNITED STATES PATENTS

| | | | |
|---|---|---|---|
| 3,615,449 | 10/1971 | Greenaway | 95/35 |
| 3,582,208 | 6/1971 | Idler | 355/132 |
| 3,584,948 | 6/1971 | Herriott | 350/162 R X |
| 3,559,549 | 2/1971 | McKee | 95/1 R |
| 3,601,018 | 8/1971 | Lange | 95/1 R |

OTHER PUBLICATIONS

Fundamentals of Optics, Jenkins and White, 1937, Pages 290, 291, 304–308, 312–315.

*Primary Examiner*—Samuel S. Matthews
*Assistant Examiner*—Alan Mathews
*Attorney*—Robert J. Haase et al.

[57] ABSTRACT

A photographic method and apparatus for exposing a light sensitive layer using a mask spaced from said layer while avoiding "ghost lines" due to diffraction effects in the developed pattern on the layer. The mask is illuminated by pairs of collimated ray sets, either sequentially or simultaneously, at an angle relative to each other so that the constituent diffraction pattern on the light sensitive layer resulting from one ray set of a pair is shifted with respect to the constituent diffraction pattern attributable to the other ray set of the pair. The shift is such that the ratio of the "ghost line" intensity to the maximum intensity in the composite diffraction pattern is reduced relative to the corresponding ratio in each of the constituent diffraction patterns. The pairs of ray sets are produced by spacially displaced fixed light sources or by a rotating optical system using a single light source.

10 Claims, 5 Drawing Figures

METHOD OF EXPOSURE FOR GHOST LINE SUPPRESSION

BACKGROUND OF THE INVENTION

The invention relates to a method of exposing light-sensitive layers to very finely structured light patterns, in particular, of exposing a photoresist layer by means of masks during the manufacture of integrated circuits.

For the manufacture of integrated circuits, several thousand circuit elements, such as transistors, diodes, resistors, etc., and the necessary electrical connections are in many cases produced on a wafer of several $cm^2$, using photolithographic processes. To this end, the wafer is photoresist-coated prior to the frequently numerous process steps, the resist being subsequently removed in the areas to be coated or treated by exposure to a suitable light pattern. Owing to the extremely small size of the individual circuit elements — the dimensions of some elements or conductors being only several $\mu$ or fractions thereof — the requirements to be met with regard to the quality and resolution of the imaging systems used for transferring the light pattern are in many cases excessive, if not almost unrealistic.

Previously, wafers with periodically recurring structures were exposed, utilizing either so-called fly eye lenses which are lens systems consisting of several thousand mini-lenses arranged adjacent to each other, or so-called "step and repeat" cameras. These cameras are arrangements in which a projection arrangement is shifted in steps over the layer to be exposed, so that periodically recurring structures are transferred by single exposures. The above-mentioned fly eye lenses and "step and repeat" cameras were used mainly, sicne previously the resolutions necessary for transferring finely structured light patterns could only be realized for small angular fields.

In the case of fly eye lenses the results obtained deteriorated as the dimensions of the structures to be imaged decreased, since it is difficult to produce the individual lenses with the necessary accuracy, their diameter being generally only some tenths of a millimeter. With regard to the "step and repeat" cameras, difficulties occurred during the mechanical shifting after each exposure, because the close tolerances required could not be kept. Moreover, owing to the great number of single exposures, the latter method is extremely time wasting.

These disadvantages are avoided in part when the photoresist is exposed by means of masks, in particular in the case of contact exposure. However, the above-mentioned difficulties are still encountered during the production of the masks proper, which have to be produced by photolithographic processes. When the patterns contained in the masks were transferred to the light-sensitive layer by contact exposure both the mask and the light-sensitive layers were damaged. If, according to practical experience, a gap of some 20 $\mu$ is left between the mask and the photoresist layer to be exposed, very narrow mask slits, in particular those arranged close adjacent to each other, are apt to lead to defects. The defects are caused by the side maxima resulting from the diffraction on these slits.

SUMMARY OF THE INVENTION

It is the object of the invention to provide a method and an arrangement which permit a light-sensitive record carrier to be exposed to very finely structured light patterns at a distance of about 20 $\mu$ between the mask and the record carrier, without the previous difficulties and shortcomings being encountered.

To this end, the invention provides for a method of exposing light-sensitive layers to very finely structured light patterns, in particular, of exposing a photoresist layer by means of a mask during the manufacture of integrated circuits, characterized in that the relative position of the mask and/or the light-sensitive layer with respect to the direction of the rays is changed continuously or in steps during exposure, so that the diffraction patterns occurring in the plane of the light-sensitive layer are shifted by about half the distance of two neighboring side maxima.

One embodiment of the invention is characterized in that exposure is carried out simultaneously or consecutively by means of rays incident from several directions and forming such an angle or such angles that the diffraction patterns associated with the individual directions in the plane of the light-sensitive layer are displaced at least pairwise by half the distance of two neighboring side maxima.

Another embodiment of the method in accordance with the invention is characterized in that for the lines of the light pattern extending in one direction two or several single exposures are used or the direction of the rays is changed, whereby this change occurs in a direction crossing the lines of the pattern.

A further embodiment of the method in accordance with the invention is characterized in that in the case of masks with slits extending in different directions, the change in the direction of the rays is effected in two or several different directions forming as great an angle as possible with the slits. In this connection it has proved to be particularly advantageous for the relative position of the exposing rays to be changed in two directions disposed perpendicular to each other, so that slits of the mask to be transferred, which extend in different directions, are taken into account.

An arrangement for applying the method in accordance with the invention is characterized in that there are four light sources arranged in the corners of an assumed square and whose spacing is such that, in the area of the light-sensitive layer to be exposed, the diffraction patterns generated by the individual light sources are displaced pairwise in relation to each other by half the distance of side maxima.

The foregoing and other objects, features and advantages of the invention will be apparent from the following more particular description of the invention as illustrated in the accompanying drawings.

DESCRIPTION OF THE PREFERRED EMBODIMENTS

Figure 1:
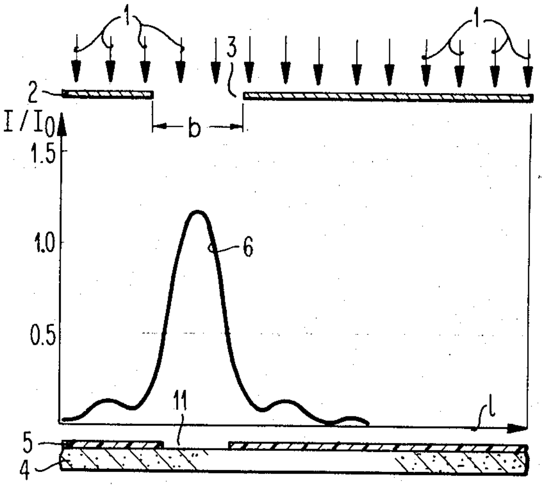
FIG. 1—diagrammatic representation of the relative intensity distribution during exposure thorugh a narrow slit.

In FIG. 1 parallel rays 1 are incident upon a mask 2 with a narrow slit 3 which has a width of $b \approx 3\ \mu$. Below the mask at a distance about 20 $\mu$ wafer 4 is arranged which is coated with a photoresist layer 5. If the width $b$ of slit 3 is only several $\mu$, an intensity distribution as shown by curve 6 results in the area of photoresist layer 5. In the present example it is assumed that the distance between mask 2 and photoresist layer 5 is 12 $\mu$, the width of slit 3 is 2.5 $\mu$ and the wave length is 0.365 $\mu$. These conditions and thus the shape of the curve 6 are defined by the parameter $F = (b^2/\lambda z)$. For the above-mentioned values F equals 1.4.

Figure 2:
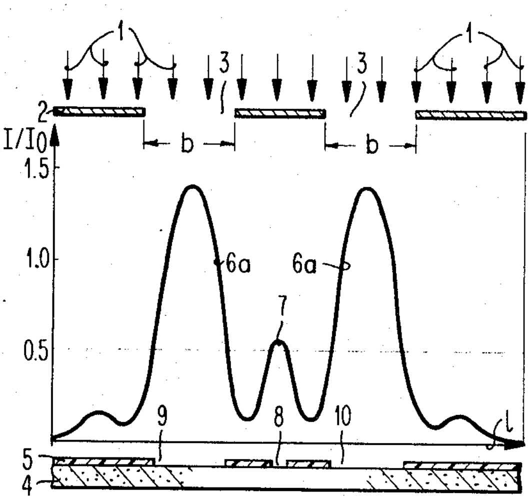
FIG. 2—diagrammatic representation of the relative intensity distribution during exposure through a double slit.

In the case of a greater F a number of minima result in the center of the maximum formed by curve 6, so that for the generation of line patterns without lands it is necessary for the exposure to be so attuned to the sensitivity of the photoresist layer that full exposure of the photoresist occurs at only half the intensity value. Full exposure hereafter means that it leads to the photoresist layer in the exposed area to be completely removed. In the arrangement of FIG. 2 mask 2 has two narrow slits 3, each of which is associated with a maximum and a number of side maxima in the area of the light-sensitive layer 5. For parallel rays the relative intensity distribution is as shown by curve 6a. Superposition of the squares of the amplitudes results in a side maximum 7 between the two maxima. As is shown in FIG. 2, side maximum 7 exceeds half the relative intensity required. In this connection, it is pointed out that the two maxima of curve 6a, as a result of the interaction of the rays passing the two slits 3, are above the value 1 of the relative intensity. Instead of the fully exposed area 11 of FIG. 1, the arrangement in accordance with FIG. 2 comprises the areas 9 and 10 which are associated with the two slits 3 and an additional fully exposed area 8 called ghost line. As the ghost line 8 is undesirable, it has hitherto not been possible to expose photoresist layers by means of masks arranged at a short distance (about 10 to 20 $\mu$) from them, and whose slits were in the order of several $\mu$m. At certain parameters F the side minima occurring within the main maxima can be equally detrimental.

Figure 3:
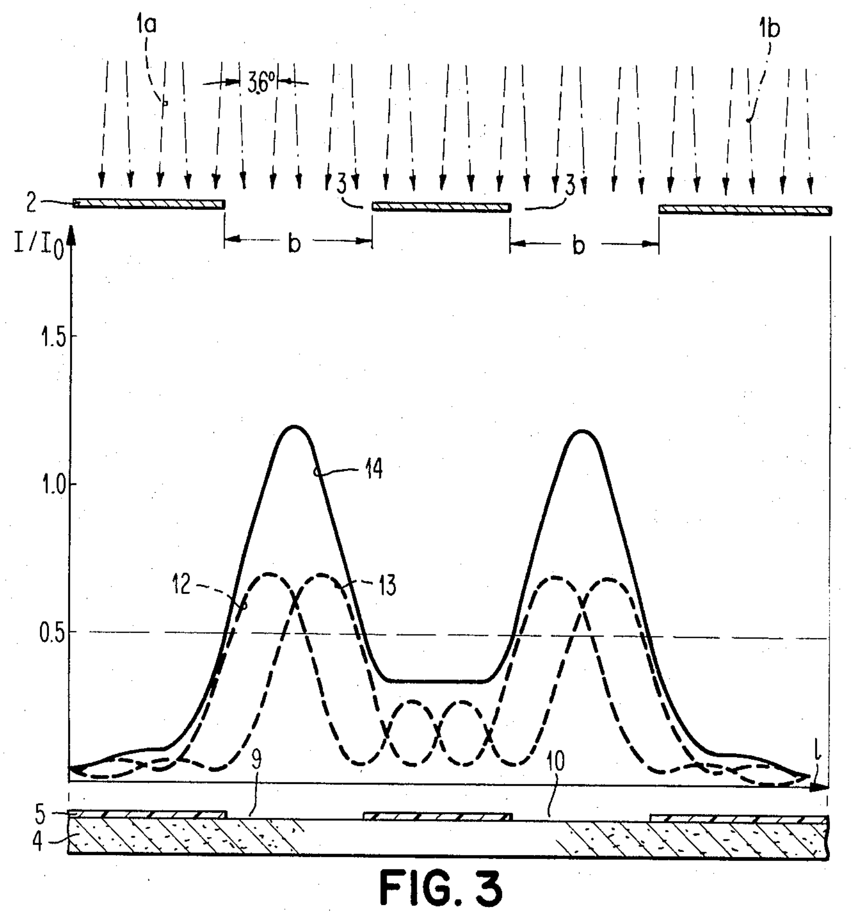
FIG. 3—diagrammatic representation of the relative intensity distribution during exposure of the photoresist layer of a wafer through a double slit, in accordance with the method of the invention.

The method in accordance with the invention is described by means of FIG. 3. Mask 2, comprising two slits 3 which have a width of 2.5 $\mu$m, is arranged at a distance of 12 $\mu$m from the photoresist layer 5 covering wafer 4. Mask 3 is successively exposed to two parallel coherent rays 1a and 1b which together form an angle of 3.6°. However, it is also possible for the slits to be simultaneously exposed to two rays 1a and 1b which are coherent in relation to each other. In the case of the rays 1a the relative exposure intensities in the area of the photoresist layer 5 are as shown by curve 12, whereas rays 1b lead to the relative exposure intensity distribution as represented by curve 13. Distribution 14 is obtained by adding the two intensities. Owing to the interaction of the rays passing slits 3, the maximum values of the distribution 14 are above 1.2, whereas the minimum between the two maxima is essentially below half the relative intensity of the rays 1a and 1b. When the distance between slits 3 is increased, side maxima of a higher order, rather than the first side maxima of the maxima of the intensity distribution associated with the two slits 3 (FIG. 3), are superimposed upon each other, so that the indentation between the two main maxima becomes deeper than in the curve of FIG. 3. In such an arrangement which utilizes a mercury vapor lamp having a wave length of $\lambda = 0.365$ no ghost lines occur and the value of 0.5 of the exposure intensity provided for full exposure is undercut considerably.

Figure 4:
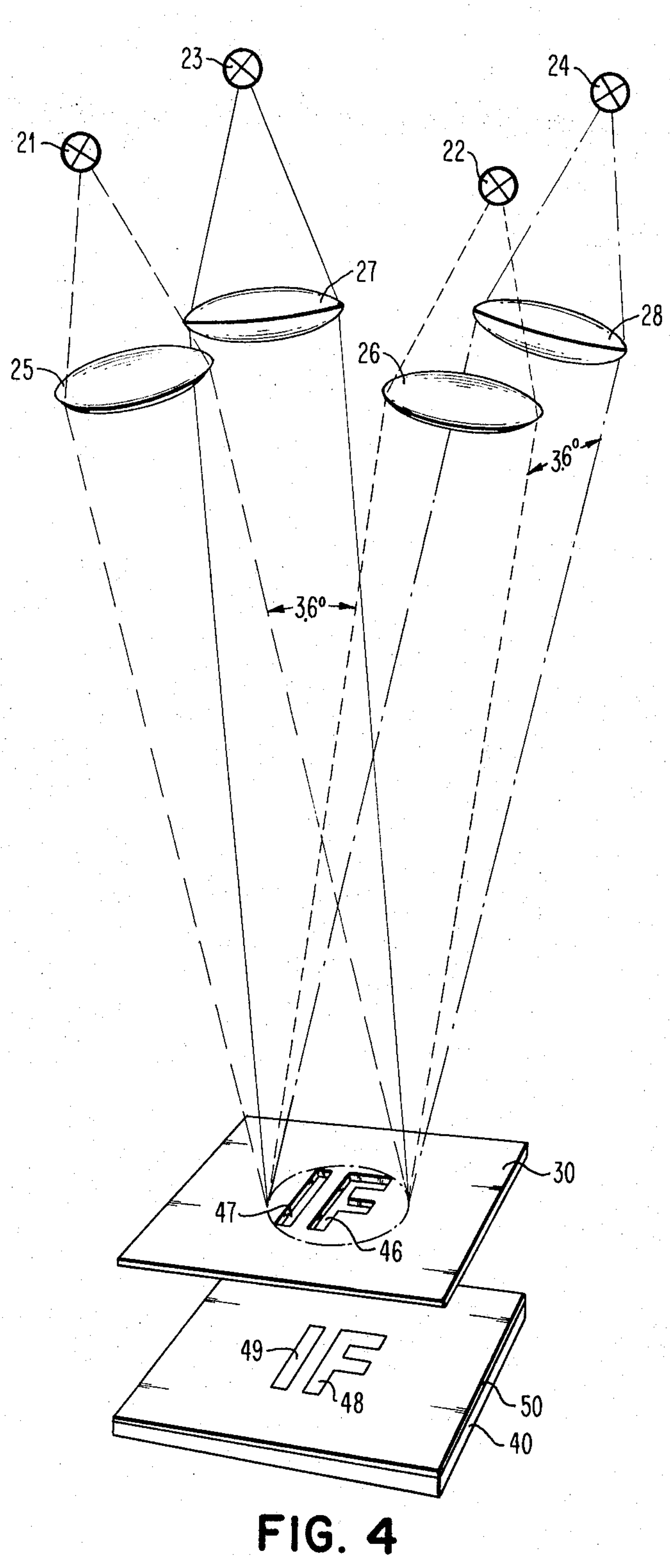
FIG. 4—diagrammatic representation of an arrangement for applying the method in accordance with the invention.

FIG. 4 shows an arrangement for applying the method in accordance with the invention. This arrangement consists of four light sources 21, 22, 23 and 24 arranged in the corners of an assumed square. Four condenser lenses 25, 26, 27 and 28 are associated with these light sources. The arrangement is such that condenser lenses 25 and 26, 25 and 27, 26 and 28, as well as 27 and 28 generate parallel rays forming pair-wise an angle of 3.6°. Mask 30 disposed in the common area of the parallel rays generated by condenser lenses 25 to 28 comprises slit pairs 46 and 47 which are arranged perpendicular to each other. To render the representation readily understandable, wafer 40 covered by photoresist layer 50 and arranged below mask 30 is shown at an enlarged distance from the latter. The actual distance between the photoresist layer 50 and the bottom side of mask 30 is about 20 $\mu$m, while the widths of the slits 46 and 47 and their spacing are about 2 to 3 $\mu$m. Photoresist layer 50 can be exposed by simultaneously exciting the light sources 21, 22, 23 and 24. However, it is also possible to excite the light sources 21 to 24 at successive points in time, in order to obtain in the plane of the photoresist layer 50 an image 48, 49 of the slit pairs 46 and 47 contained in mask 30, which is free from ghost lines.

Figure 5:
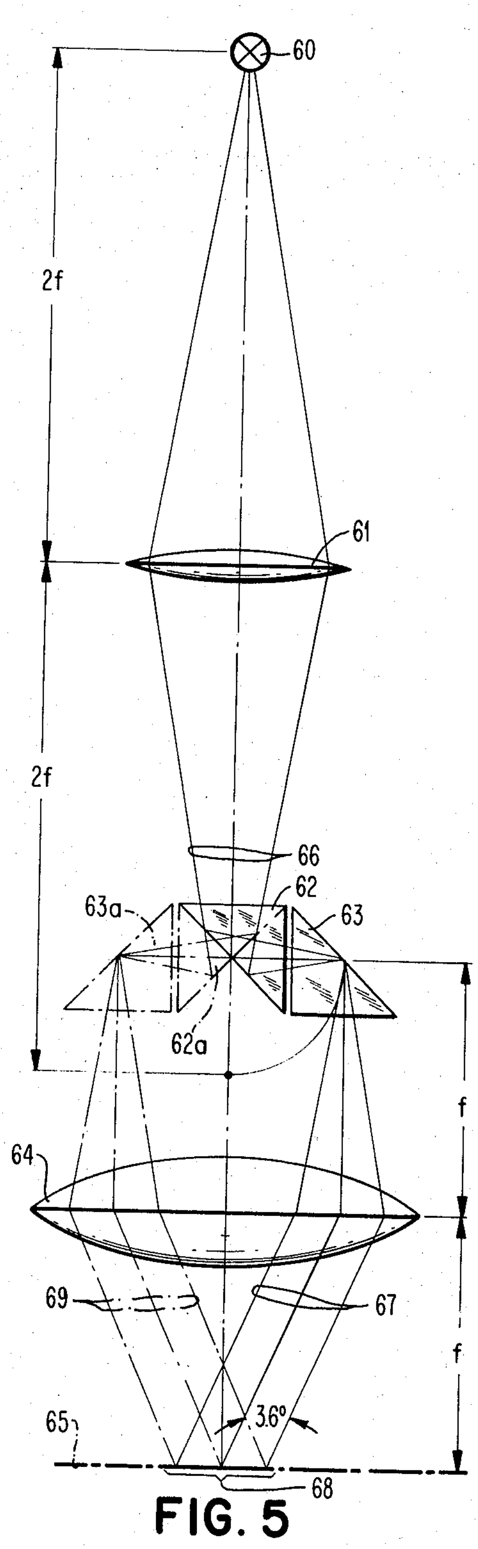
FIG. 5—representation of another embodiment for applying the method in accordance with the invention.

FIG. 5 shows a preferred embodiment of the invention. The arrangement consists of a light source 60, a lens 61, two reflecting prisms 62 and 63 and a lens 64. Light source 60 is arranged at twice the focal distance from lens 61. The distance of the totally reflecting area of the prism 63 from lens 61 is equal to twice its focal width. This leads to light source 60 being imaged in the totally reflecting area of the prism 63. Lens 64 is arranged at a distance equaling its focal width from the image of the light source 60 on the totally reflecting face of the prism 63 and at the same distance from plane 65. Prisms 62 and 63 are arranged at an adjustable spacing between their short sides and can be rotated about the joint optical axis of the lenses 61 and 64. FIG. 5 shows that in the position of prisms 62 and 63 marked by heavy lines the arrangement generates rays 67 in the area of plane 65, by means of which the latter is exposed in area 68. In the positions of the prisms 62 and 63 marked by dotted lines 62a and 63a, rays 69 exit from lens 64, which in plane 65 expose the same area 68. The arrangement is such that rays 67 and 69 form an angle of 3.6°. It is obvious that by rotating the prism pair 62, 63 through 180°, plane 65 in area 68 is successively exposed to two rays forming an angle of 3.6°. By changing the spacing between the short sides of the prisms 62 and 63 the angle between rays 67 and 69 can be adapted at random. If the prism pair 62, 63 is rotated through 90°, four different rays are incident at successive points in time on plane 65. These rays form in pairs angles with each other, which are a function of the distance of the short sides between prisms 62 and 63. If, as shown in FIG. 4, a mask 30 is arranged in plane 65, the pattern of the mask 30, without ghost lines, is generated on a photoresist layer 50 arranged below the mask. In many cases, it is sufficient for the direction of the rays to be changed in steps, instead of continuously.

In place of monochromatic rays it is also possible to use rays having a certain bandwidth.

While this invention has been particularly described with reference to the preferred embodiments thereof, it will be understood by those skilled in the art that the foregoing and other changes in form and details may be made therein without departing from the spirit and scope of the invention.

What is claimed is:

1. The method of exposing a light sensitive layer to a very finely structured pattern of light comprising:
- providing a pair of collimated ray sets,
- providing a mask having said pattern and through which said layer is exposed by said ray sets, and
- directing each said ray set at said layer through said mask along a respective direction of incidence and at a respective angle of incidence relative to said mask,
- each said ray set producing a respective diffraction pattern occurring in the plane of said layer,
- each said angle of each said ray set being selected so that the diffraction patterns resulting from said pair of collimated ray sets and occurring in the plane of said layer are shifted relative to each other by about half the distance of two neighboring side maxima of each said diffraction pattern.

2. The method defined in claim 1 wherein said ray sets are employed simultaneously.

3. The method defined in claim 1 wherein said ray sets are employed successively.

4. The method defined in claim 1 wherein each said ray set is substantially monochromatic.

5. The method defined in claim 1 wherein each said angle of incidence is the same.

6. The method defined in claim 5 wherein said ray sets are produced by rotating a single ray set about an axis normal to the plane of said mask so that the direction of incidence of said single ray set relative to said mask is changed but the angle of incidence of said single ray set relative to said mask is unchanged during the rotation.

7. Apparatus for exposing a light sensitive layer to a very finely structured light pattern comprising:
- a pair of collimated ray sets,
- a mask having said pattern and through which said layer is exposed by said ray sets, and
- means for directing each said ray set at said layer through said mask along a respective direction of incidence and at a respective angle of incidence relative to said mask,
- each said ray set producing a respective diffraction pattern occurring in the plane of said layer,
- each said angle of each said ray set being selected so that the diffraction patterns resulting from said pair of collimated ray sets and occurring in the plane of said layer are shifted relative to each other by about half the distance of two neighboring side maxima of each said diffraction pattern.

8. Apparatus as defined in claim 7 wherein said respective directions of incidence are transverse to each other.

9. Apparatus as defined in claim 7 wherein each said angle of incidence is the same.

10. Apparatus as defined in claim 9 and further including:
- means for producing said ray sets by rotating a single ray set about an axis normal to the plane of said mask so that the direction of incidence of said single ray set relative to said mask is changed but the angle of incidence of said single ray set relative to said mask is unchanged during the rotation.

* * * * *